United States Patent [19]

Opie

[11] Patent Number: 4,758,742
[45] Date of Patent: Jul. 19, 1988

[54] SHUNT ACTIVATED PULSE GENERATOR

[75] Inventor: John E. Opie, Stony Creek, Conn.

[73] Assignee: Echlin Inc., Branford, Conn.

[21] Appl. No.: 72,916

[22] Filed: Jul. 14, 1987

Related U.S. Application Data

[63] Continuation-in-part of Ser. No. 38,010, Apr. 14, 1987, Pat. No. 4,743,780.

[51] Int. Cl.$^4$ .................. G11C 11/04; H03K 3/45
[52] U.S. Cl. .................. 307/419; 307/106; 365/133; 360/123; 360/125
[58] Field of Search .................. 307/105–110, 307/410–419; 365/133; 360/110, 112, 113, 115, 125, 118, 123, 84

[56] References Cited

U.S. PATENT DOCUMENTS

| | | | |
|---|---|---|---|
| 3,818,465 | 6/1974 | Wiegand | 365/133 |
| 3,820,090 | 6/1974 | Wiegand | 365/133 |
| 3,866,193 | 2/1975 | Wiegand | 365/133 |
| 3,879,754 | 4/1975 | Ballinger | 360/123 X |
| 3,971,958 | 7/1976 | Rogora et al. | 307/106 |
| 4,123,790 | 10/1978 | Moeller et al. | 360/125 X |
| 4,136,370 | 1/1979 | Moeller | 360/125 X |
| 4,164,770 | 8/1979 | Jeffers | 360/113 |
| 4,263,523 | 4/1981 | Wiegand | 307/419 |
| 4,287,573 | 9/1981 | Lathlaen | 365/133 |
| 4,309,628 | 1/1982 | Wiegand | 307/419 |
| 4,484,090 | 11/1984 | Wiegand et al. | 307/419 |
| 4,593,209 | 6/1986 | Sloan | 307/419 |
| 4,635,227 | 1/1987 | Normann | 365/133 |

Primary Examiner—William M. Shoop, Jr.
Assistant Examiner—Paul Ip
Attorney, Agent, or Firm—McAulay, Fields, Fisher, Goldstein & Nissen

[57] ABSTRACT

A pulse generator employs a Wiegand wire module within two soft iron ferro-magnetic elements. Four magnets having appropriate polarities are positioned on faces of the ferro-magnetic elements to provide first and second magnetic circuits. The flux in these two magnetic circuits is collected, conducted and guided by the ferro-magnetic elements toward an air gap between the two guide elements. The center portion of the Wiegand wire is at the air gap. Cylindrical cavities in these two guide elements shield the ends of the Wiegand wire to minimize the incidence of external flux from the Wiegand wire. Saturation of the flux at the air gap between the two guide elements causes leakage flux to be incident on the Wiegand wire.

The two magnetic circuits created by the magnets are approximately equal in magnitude and opposite in direction at the Wiegand wire. As a consequence, in the normal state, these two magnetic circuits do not affect the state of the Wiegand wire. When a soft iron ferro-magnetic shunt is brought adjacent to the two magnets which determine a first one of the magnetic circuits, an increase of flux in that first magnetic circuit switches the state of the Wiegand wire to a first switched state. When the shunt element is moved adjacent to the other two magnets, the flux from the second circuit increases to switch the Wiegand wire to a second switched state opposite to the first switched state.

12 Claims, 5 Drawing Sheets

WAVE FORM OF OUTPUT PULSE TRAIN

SHUNT ACTIVATED PULSE GENERATOR

REFERENCE TO RELATED APPLICATIONS

This patent application is a continuation-in-part of patent applications Ser. No. 038,010, filed Apr. 14, 1987, now U.S. Pat. No. 4,743,780 and entitled Pulse Generator With Shielded Wiegand Wire.

BACKGROUND OF THE INVENTION

This invention relates in general to a pulser for generating a pulse by switching the state of a magnetic device that has come to be known as a Wiegand wire and, more particularly, to a mechanism and method for controlling the magnetic field to which a Wiegand wire module is subjected so as to provide an improved output pulse.

The magnetic device employing the pulser of this invention is of the type disclosed in U.S. Pat. No. 4,247,601 issued Jan. 27, 1981. This magnetic device is a ferro-magnetic wire segment which has been treated to provide core and shell portions with divergent magnetic properties. The wire is now known in the art as a Wiegand wire.

The Wiegand wire essentially has two states. In one of these states, the magnetization of the core and shell are in opposite directions and this state may conveniently be called a reverse state. In the other state, the magnetization of the core and shell are in the same direction and this state may conveniently be called the confluent state. When the magnetic field to which the wire is subjected passes a threshold in one direction or the other, the wire switches state. The switch in state is extremely rapid so that the rate of change of flux through a pick-up coil wrapped around the wire is great. As a consequence the output from the pick-up coil is very substantial, in some cases being as high as eight volts into an open circuit on a repeatable basis. The wire and pick-up coil is referred to as a module.

The characteristics of a pulse generator which are desirable include simplicity, low cost, versatility, repeatability, reliability and high output pulse. There are inevitably certain trade-offs in enhancing certain of these characteristics at the expense of other characteristics. However, it is desirable to provide an optimum combination of these characteristics with whatever enhancement of the characteristics may be achieved in an improved design and such is the general purpose of this invention.

U.S. Pat. No. 4,309,628 issued Jan. 5, 1982, discloses an arrangement in which a Wiegand wire module is triggered by a shunt element. Disclosed therein are various shunt structures which might be employed to provide a shunt trigger for the Wiegand wire. Disclosed in that patent are (1) a non-ferrous disk with low reluctance elements deployed on the face of the disk, (2) a rotating non-ferrous drum with low-reluctance elements deployed around the rim of the drum, (3) a ferrous rotating disk with a series of ferrous lobes that protrude radially from the rim of the disk, and (4) a ferrous rotating disk with a plurality of cut-out zones on the face of the disk.

U.S. Pat. No. 4,484,090 entitled Pulsed Generator With Shaped Magnetic Field issued Nov. 20, 1984 discusses the problem that arises because of the demagnetization field at the ends of the Wiegand wire. That patent discloses a pulser in which the excitation field is shaped so as to minimize the axial field at the ends of the wire thereby minimizing the effects of the demagnetization field at the end of the wire. This shaped field design provides an improved pulser in that the more rapid switch in flux when the demagnetization field is minimized provides a larger output pulse in the pickup coil than is the case when the field at the ends of the wire is significant. The increased pulse magnitude provided by the shaped field design disclosed in this patent serves to enhance the utility of the pulser. However, it has been found that the improvement provided is not as consistent and repeatable as is desirable in operating equipment. In particular, the effects of ambient fields and, most particularly, changing ambient fields results in a loss of repeatability and consistent pulse output magnitude.

Accordingly, it is a purpose of this invention to provide a pulser in which the enhanced output pulse obtained by a shaped magnetic field is provided in a repeatable and consistent fashion.

It is a related purpose of this invention to provide such a pulser as it will be fairly insensitive to the environmental conditions, will be relatively easy to calibrate and will be relatively tolerant of variations in the spacing of the excitation shunt so as to provide a consistent pulse output and, in particular, to provide a symmetric output in which the alternate positive going and negative going pulses are substantially similar in absolute magnitude.

The co-pending parent patent application discloses a pulser which achieves this purpose in a device actuated by a magnet passed over the pulser unit to magnetically couple to the Wiegand wire thereby switching the state of the Wiegand wire and generating an appropriate output pulse. However, there are applications for a pulse generating unit where it is desirable to generate the pulse by bringing a low reluctance ferro-magnetic shunt adjacent to the Wiegand wire module. Applications involving high pulse count preferably use a shunt trigger rather than a magnet trigger because it is less costly to employ multiple ferro-magnetic shunts rather than multiple high quality magnets. One application for such a shunt triggered pulser is in an anti-skid device where the pulser is used as part of a velocity sensor and may generate a hundred pulses during a revolution of the wheel of the vehicle.

Accordingly, it is an object of this invention to provide all of the above-referenced objects in the context of a shunt actuated pulser.

BRIEF DESCRIPTION

The pulse generating unit of this invention involves a Wiegand wire module mounted within two soft ferromagnetic guide elements. The guide elements magnetically shield the two ends of the Wiegand wire module so as to substantially eliminate the known end demagnetization effect which reduces the output pulse when the Wiegand wire switches state. This is achieved by having small cylindrical cavity elements within each of the two guides into which cavity elements the ends of the Wiegand wire module are mounted.

Magnets mounted onto the guide elements constitute flux generating units for first and second magnetic circuits, respectively. The guide elements collect, conduct and guide flux from these magnets in such a fashion as to direct the flux across an air gap between the two guide elements. The polarity of the magnets and their positioning is such that the flux from the two magnetic circuits are substantially equal in amplitude and opposite in direction at an air gap between the two guide elements. The result is that in the normal state, the Wiegand wire is subject to substantially no incident flux.

A low reluctance shunt brought adjacent to the magnets in the first magnetic circuit substantially reduces the reluctance in that circuit thereby increasing the flux in that circuit. The result is an unbalance of flux at an air gap between the two guide elements. As a consequence, the unbalanced leakage flux is enough to drive the Wiegand wire and cause it to change state. The change in state of the Wiegand wire provides rapid change in the flux coupled through the pick-up coil on the module thereby producing a significant usable output pulse.

A similar result occurs when the low reluctance shunt is brought adjacent to the magnets that generate the second magnetic circuit.

BRIEF DESCRIPTION OF THE FIGURES

FIG. 4 is a cross-sectional schematic of the FIG. 1 pulser. The plane of FIG. 4 includes the axis of the Wiegand wire and is perpendicular to the face of the magnetic guides 12 on which the magnets are mounted. FIG. 4 only shows two magnets M3 and M4 of the four magnets employed. FIG. 4 schematically indicates the path of the lines of flux in the first magnetic circuit which incorporates the magnets M3 and M4 as the energizing elements.

DESCRIPTION OF THE PREFERRED EMBODIMENT

As shown in the FIGs., the pulser 10 includes a Wiegand wire module 11 mounted within a cavity that is defined by two magnetically soft ferromagnetic guide elements 12a and 12b. The module 11 and both guides 12 are held on a molded plastic base 14. Two terminals 16 (only one is shown) extend through the base 14 and are connected to the ends of the pick-up coil 18 that is a part of the module 11.

A first set of magnets M1, M2 are mounted respectively on the guide elements 12a and 12b. The direction of magnetization of these magnets M1 and M2 are opposite to one another. The magnets M1 and M2 constitute the active elements in a first magnetic circuit which is coupled through the guide elements 12a and 12b to the Wiegand wire module 11. A second set of magnets M3 and M4 are mounted respectively on guide elements 12a and 12b. These magnets M3 and M4 provide the active elements in a second magnetic circuit which is coupled through the guide elements 12a and 12b to the Wiegand wire module 11. The magnetization of M3 and M4 are opposite in direction so that they can provide the appropriate circuit.

The direction of magnetization of the magnets M1 and M3 on guide element 12a are in opposite directions from one another and of necessity the same opposite magnetization relationship exists between the magnets M2 and M4 on the guide element 12b. As a result, the directions of the first and second magnetic fields at the Wiegand wire module 11 are opposed to one another. Because the magnets M1, M2, M3 and M4 are of the same strength and the pairs are positioned symmetrically relative to the axis of the module 11, the strength of the two fields at the Wiegand wire module are normally equal to one another. Because they are opposite to one another, they substantially cancel out at the Wiegand wire module. Until the strength of one or the other field is substantially increased by means of the shunt 30 that is discussed hereinafter, the Wiegand wire module 11 is substantially uninfluenced by these fields.

A stainless steel cap 20 fits over the guide elements 12 and the periphery of the base 14. The base 14 includes a short positioning lug 17 to aid in orienting the pulser when assembling it onto other equipment.

Figure 1:
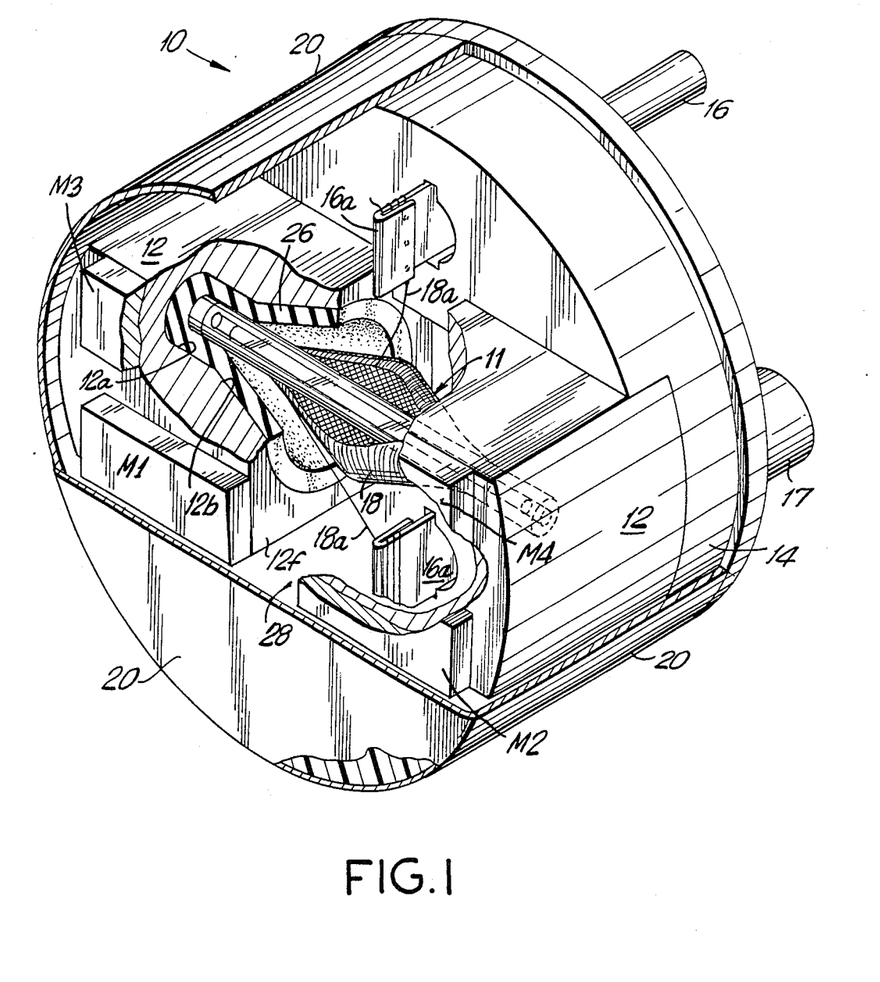
FIG. 1 is a cutaway perspective view of one embodiment of this invention showing the ferromagnetic guides 12 within which is contained the module 11 comprising the Wiegand wire and pick-up coil. The magnet M1 is shown and only a portion of the other three magnets is shown.
Figure 2:
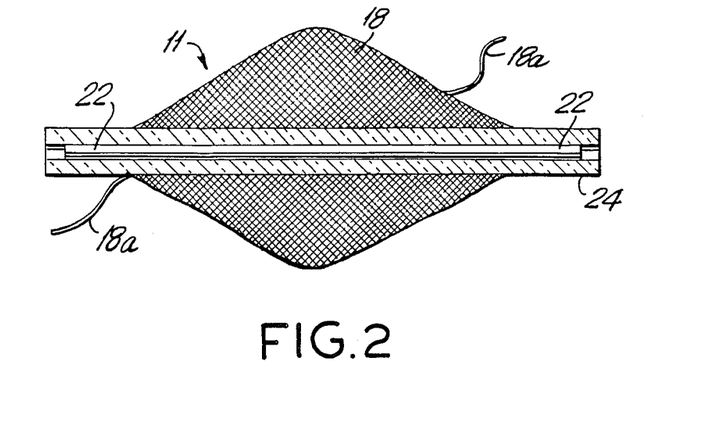
FIG. 2 is a longitudinal sectional view of the module 11 showing the elliptical pick-up coil 18.

The module 11 consists of (a) a Wiegand wire element 22 held within a glass tube 24 and (b) the pick-up coil 18 wound around the central portion of the glass tube 24. The coil 18 is coupled to the changing magnetic field produced by the switch in the magnetic state of the Wiegand wire 22. The ends of the glass tube 24, and thus the ends of the Wiegand wire 22, are mounted in shallow cylindrical recesses 12a of the guide elements 12. Rubber end caps 26 are positioned over the ends of glass tube 24 and fit within the cylindrical recesses 12a so as to provide a firm, resilient and safe mount for the glass tube 24. These end caps 26 extend inboard along the conical walls of the cavity in the guide 12. Only one end cap 21 is shown. The break away view eliminates the other cap.

Figure 3A:
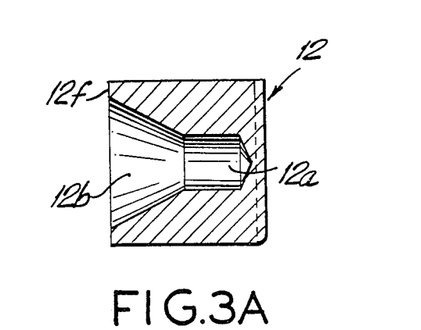
FIGS. 3A and 3B are sectional and end views of one of the guides 12.
Figure 3B:
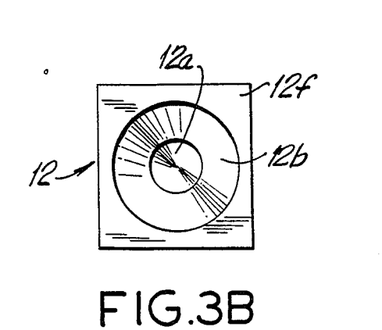
Figure 4:
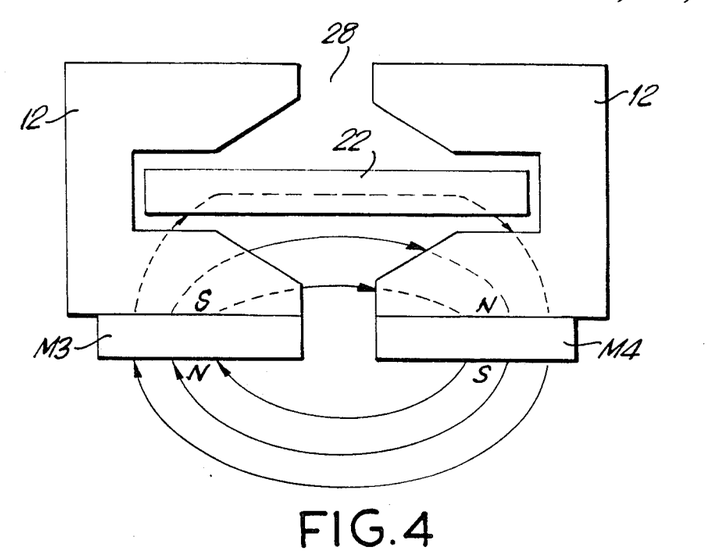

The cavity within each guide element 12 is defined by the cylindrical recess 12a at the outboard ends of each cavity and by the truncated conical zone 12b which is inboard from the cylindrical recess 12a. The conical cavity zone 12b has its smallest diameter at the cylindrical recess 12a and increases in diameter to the central face 12f of the guide element 12. The central faces 12f of the two guide elements 12 are spaced from one another thereby establishing a small gap 28 between the two guide elements 12.

Lead wires 18a from the pick-up coil 18 are wrapped around a folded over terminal end 16a which is crimped and welded to hold the lead wires 18a in place and assure good electrical contact. The terminal 16 is a cylindrical terminal that extends through the plastic base 14 and has the flat end 16a. Accordingly, an output pulse generated in the pick-up coil 18 will be transmitted to the terminal 16.

Figure 5:
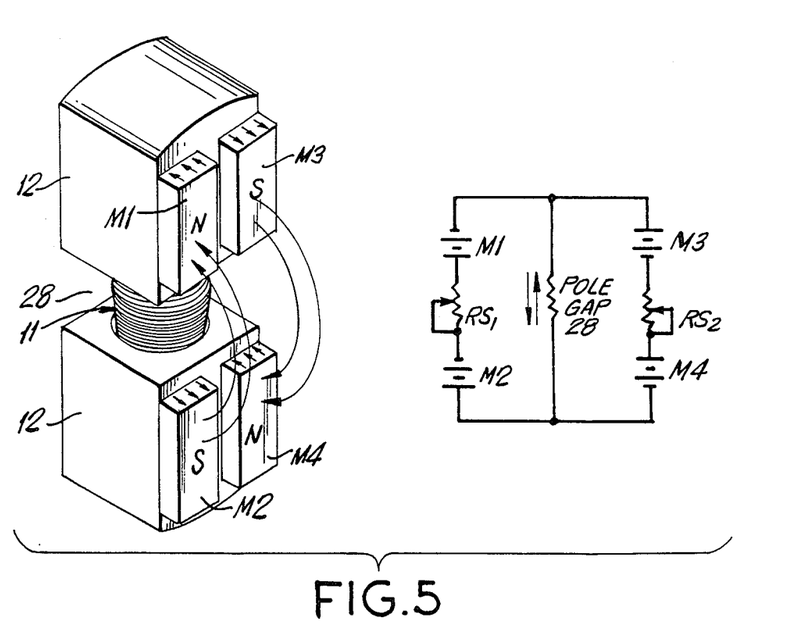
FIG. 5 is a simplified perspective of the FIG. 1 and FIG. 4 device showing the four magnets employed. Associated with FIG. 5 is an equivalent electrical circuit representing the two magnetic circuits involved.
Figure 6:
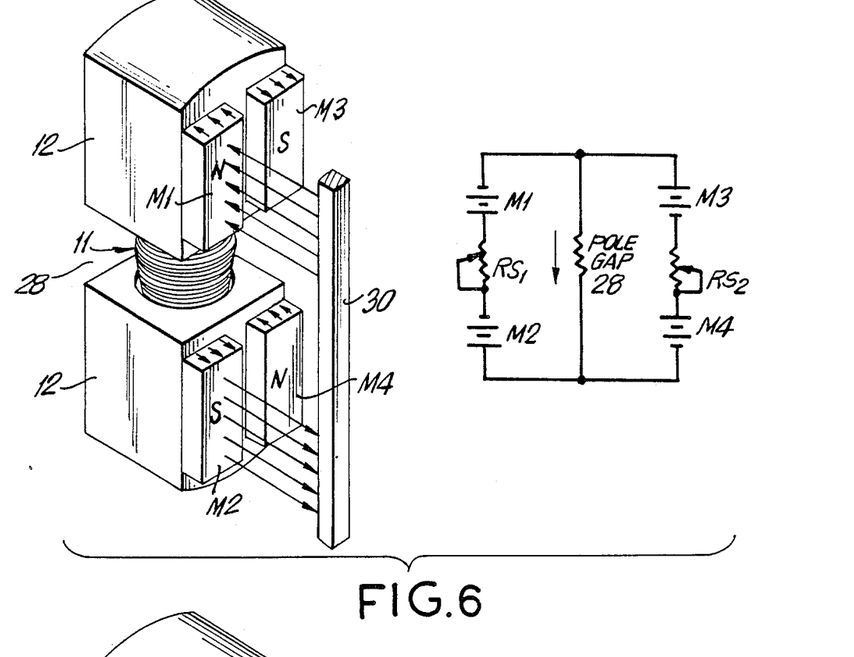
FIG. 6 illustrates the FIG. 5 device in which the ferro-magnetic shunt element 30 has been brought adjacent to the magnets M1 and M2 that constitute the energizing elements of the first magnetic circuit. Associated with FIG. 6 is an equivalent electrical circuit representing the magnetic circuit state created by the positioning of the shunt element 30 as shown.
Figure 7:
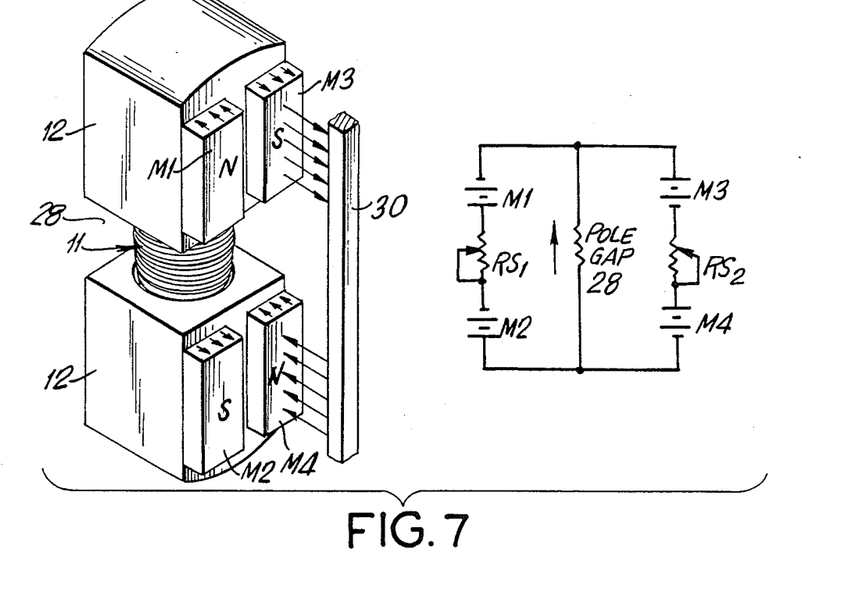
FIG. 7 is a view similar to that of FIG. 6 with the shunt element 30 placed adjacent to the magnets M3 and M4 which constitute the energizing elements for the second magnet circuit. Associated with FIG. 7 is an equivalent electrical circuit representing the magnetic circuit state created by positioning the shunt element 30 as shown.

As shown in FIGS. 6 and 7, the pulser 10 is actuated by the position of a ferro-magnetic shunt element 30. The shunt element 30 has a removed position in which case the pulser 10 has what might be called the open circuit state shown in FIG. 5. In that state, the first magnetic circuit which incorporates the magnets M1 and M2 includes the external air gap RS1 and the pole gap 28. A second magnetic circuit incorporates the magnets M3 and M4 as well as the external air gap RS2 and the pole gap 28. Because of the polarity of the four magnets relative to one another, the flux generated by the first and second magnetic circuits is substantially equal in magnitude and opposite in direction across the pole gap 28. Accordingly, the net leakage flux coupled to the Wiegand wire element 22 is nil.

However, as shown in FIG. 6, when the shunt 30 is brought into its first proximate position adjacent to the magnets M1 and M2 it provides a low reluctance external path for the magnetic field generated by the magnets M1 and M2. This decrease in the reluctance RS1 substantially increases the total flux in the first circuit thereby causing the flux across the air gap 28 to overwhelm the countervailing flux in the second circuit. The result is that the leakage flux across the air gap 28 is primarily due to the flux having the direction of the arrow shown in the equivalent circuit in FIG. 6. This leakage flux is thereby coupled to the Wiegand wire element 22 causing the Wiegand wire to switch into a first state at a rapid rate thereby generating a pulse having a first polarity in the pick-up coil 18.

Similarly, as shown in FIG. 7, when the shunt 30 is brought into its first proximate position adjacent to the magnets M3 and M4 it provides a low reluctance external path for the magnetic field generated by those magnets. This decrease in the reluctance RS2 substantially increases the total flux in the second circuit causing flux across the air gap 28 to overwhelm the countervailing flux in the first circuit. The result is that the leakage flux across the air gap 28 is primarily due to the flux having the direction of the arrow shown in the equivalent circuit in FIG. 7. This leakage flux is coupled to the Wiegand wire element 22 causing the Wiegand wire to switch into a second state at a rapid rate thereby generating a pulse having a second polarity in the pick-up coil 18.

Figure 9:
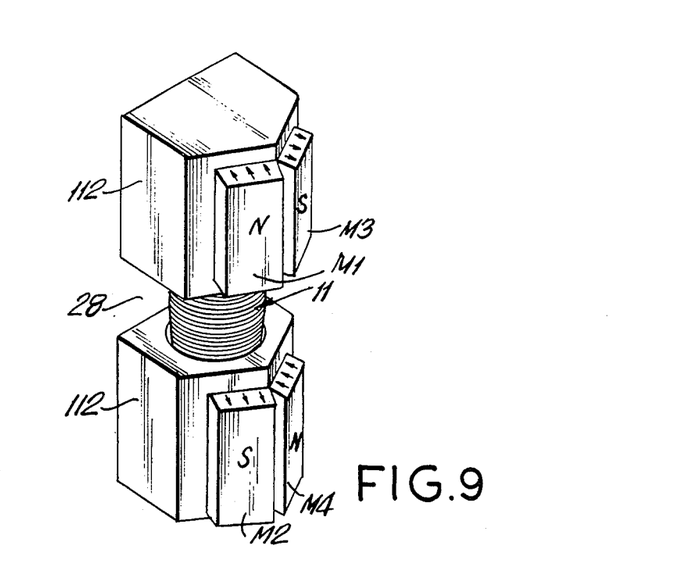
FIG. 9 is a perspective of a second embodiment of the invention.

The pulses generated by the alternate positions of the shunt 30 shown in FIGS. 6 and 7 will be of opposite polarity. A waveform of the output pulse train is shown in FIG. 9.

An hypothesis as to the operation of the Wiegand wire 22 has been described in the referenced patents and in the parent patent application recited above. Those descriptions are incorporated herein. A repetition of that discussion need not be engaged in at this point. Suffice it to state that when a strong enough external magnetic field impinges on the Wiegand wire, it captures the entire Wiegand wire forcing the Wiegand wire into what has been called a set state or confluent state. A state change in the wire occurs when the external field reverses direction. Each change of state of the Wiegand wire occurs very rapidly. Because it occurs very rapidly, the change in the pattern of the magnetic flux adjacent to the Wiegand wire changes very rapidly. This rapid rate of change of flux with time is sensed by the pick-up coil 18 to provide an output pulse.

The position and configuration of the flux guide elements 12 shape and control the magnetic field to which the Wiegand wire 22 is subjected in a fashion which optimizes the operation of the Wiegand wire segment 22. The conical or funnel shaped cavity area 12b conducts the flux from the magnets axially toward the air gap 28 between the elements 12. The ends of the wire 22 are substantially shielded from the external flux. In part, this is due to the fact that the ends of the wire 22 are spaced from the air gap 28 and, perhaps more importantly, because the greater volume of the guide element 12 immediately adjacent to the ends of the wire 22 serves to carry incident flux inboard toward the air gap 28. In this fashion, a substantially zero magnitude field at the ends of the Wiegand wire serves to substantially reduce or eliminate the demagnetization end effects which have been observed in connection with the switching of a Wiegand wire. The result is a larger output pulse from the module 10 than is achieved where these demagnetization end effects exist. This end effect phenomenon has been observed, although it is not entirely understood as to why it occurs. U.S. Pat. No. 4,484,090 is directed to a prior art technique of minimizing these end effects in a pulser. However, what has been found is that a much more consistent and somewhat greater output pulse can be obtained with the guide elements 12a and 12b. Part of the reason is believed to be that the guide elements 12 serve to shield the ends of the wire from all stray magnetic effects.

The guide elements 12 are a soft ferromagnetic material. In one embodiment, they are a powdered iron of magnetic grade and provide a low reluctance path for the magnetic field generated by the magnet 32. The cap 20, being of stainless steel material, is transparent to the magnetic flux and thus has no effect on the magnetic operation of this pulse generator unit 10.

The guide elements 12a and 12b guide and concentrate the flux so as to saturate the air gap 28 thereby creating enough leakage flux to subject the Wiegand wire 22 to an optimal excitation field.

In brief, the elements 12a and 12b provide both a magnetic shielding function for the ends of the Wiegand wire and a magnetic flux ducting function to facilitate switching.

In one specific embodiment of this invention which has been constructed and tested, a glass tube 24 approximately 1.1 cm in length. Wire 22 has a diameter of approximately one-quarter millimeter and it is slipped into the tube 24 which has an outer diameter of approximately 1 mm and an inner diameter of approximately 0.38 mm. The wire need not be fastened inside the tube because the two end-caps 26 prevent the wire from falling out. The coil 18 has 2,000 turns of No. 44 magnet wire and it is positioned on the center 7 mm of the tube 24. Approximately 2 mm of each end of the tube 24 is contained in the cap portion of the rubber end-cap 26. The guide elements 12a, 12b and the shunt 30 are made out of magnetic grade powdered iron. Each guide element 12a, 12b has an overall length of approximately 6.3 mm and square sides of approximately 6.3 mm. The axial length of the two cavities 12a and 12b is approximately 5 mm and the axial length of the cavity 12b is approximately 2.8 mm. The gap 28 between the two guide faces 12f is approximately 2.54 mm.

Figure 8:
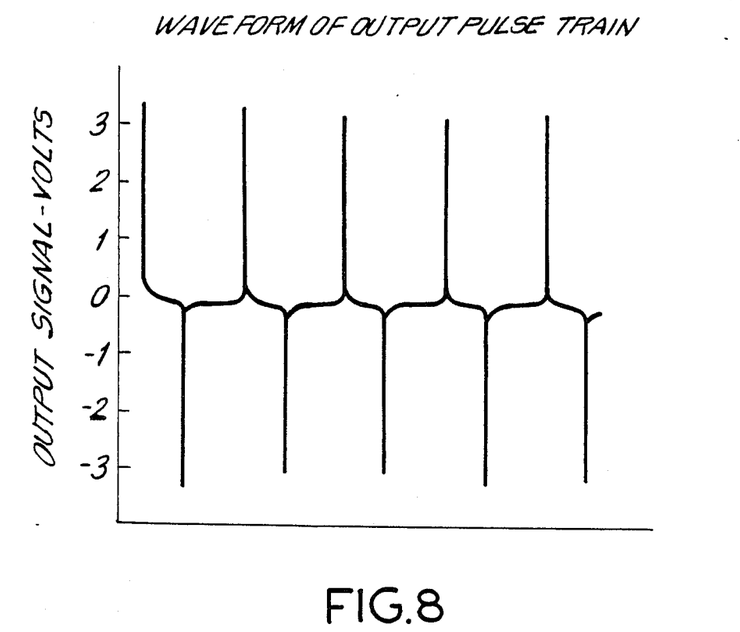
FIG. 8 is a graph of the alternate pulses generated by the alternate states shown in FIGS. 6 and 7.

In operation, a shunt element is alternately brought adjacent to the magnets M1/M2 of the first circuit and the magnets M3/M4 of the second circuit to cause a switch of state that provides the pulse train of FIG. 8.

The shunt that triggers these pulses need not be a single shunt element. A typically shunt trigger could be a rotating disk having a series of lobes or projections of low reluctance material in which each projection first triggers a positive pulse and then a negative pulse.

Although an exact and complete theory for the operation of this invention has not presently been developed, the switching mode is one that has been called short field symmetric drive mode and is describe in connection with FIG. 5B of the parent patent application.

What is claimed is:

1. A pulse generator comprising:
   a magnetic field actuated sensor,
   first magnet means having first and second spaced apart poles,
   second magnet means having third and fourth spaced apart poles,
   ferro-magnetic guide means,
   a first magnetic circuit comprising said first pole, said second pole and said guide means, said first magnetic circuit having a predetermined gap,
   a second magnetic circuit comprising said third pole, said fourth pole and said guide means, said second magnetic circuit having a predetermined gap,
   said predetermined gap of said second magnetic circuit coinciding with said predetermined gap of said first magnetic circuit,
   said sensor being positioned in said predetermined gap,
   said guide means serving to concentrate the flux generated by said first and second poles of said first circuit in said gap along a predetermined orientation at said gap, said guide means also serving to concentrate the flux generated by said third and fourth poles of said second circuit in said gap along said predetermined orientation at said gap,
   said flux from said first circuit in said gap having a first direction along said orientation and said flux from said second circuit in said gap having a second direction along said orientation, said first and second directions being opposed to one another,
   whereby the placing of a low reluctance shunt adjacent to said first and second poles will increase the magnitude of the field in said first circuit thereby increasing the flux from said first circuit at said sensor along said first direction to cause the state of said sensor to be affected by that field, and
   whereby the placing of a low reluctance shunt adjacent to said third and fourth poles will increase the magnitude of the field in said second circuit thereby increasing the flux from said second circuit at said sensor along said second direction to cause the state of said sensor to be affected by that field.

2. The pulse generator of claim 1 wherein:
   said guide means has first and second guide elements spaced from one another to provide said predetermined gap.

3. The pulse generator of claim 1 further comprising:
   a low reluctance shunt movable relative to said magnetic poles between a first proximate position near to said first and second poles and a second proximate position near to said third and fourth poles,
   said shunt when in said first proximate position providing a low reluctance path for said first circuit to enhance the magnitude of said first field at said sensor,
   said shunt when in said second proximate position providing a low reluctance path for said second circuit to enhance the magnitude of said second field at said sensor.

4. The pulse generator of any of claims 1, 2 and 3 wherein said sensor is a Wiegand wire module including a Wiegand wire segment and a pick-up coil mounted on said segment.

5. A device for the generation of an electric pulse in response to a changing magnetic field comprising:
   a pulser unit having a Wiegand wire module and ferro-magnetic guide means,
   said Wiegand wire module including a Wiegand wire segment and a pick-up coil wound on said segment, said module having first and second end portions,
   said ferro-magnetic guide means surrounding at least first and second ends of said module, said guide means including a high reluctance zone adjacent to the center of said module and a lower reluctance zone adjacent to the ends of said module,
   said guide means being shaped to collect and guide flux that is incident on the pulser unit to said high reluctance zone causing leakage flux to be coupled to the center portion of said Wiegand wire,
   first magnet means,
   second magnet means,
   said first magnet means and said guide means comprising a first magnetic circuit having a first magnetic field coupled to said module,
   said second magnet means and said guide means providing a second magnetic circuit having a second field coupled to said module,
   said first and second fields having a normal state in which said fields are substantially opposite in direction and equal in absolute magnitude along the axis of said center portion of said Wiegand wire,
   whereby the placing of a low reluctance shunt adjacent to one of said magnet means will increase the magnitude of the field in the associated magnetic circuit thereby increasing the flux from that magnetic circuit at said module to cause the state of said Wiegand wire to be affected by that field.

6. The device of claim 5, wherein:
   said first magnet means comprises first and second spaced apart magnets, said first magnetic circuit linking a pole of said first magnet having a first polarity to a pole of said second magnet having a second polarity through an external air gap, said first circuit linking a pole of said first magnet having a second polarity to a pole of said second magnet having a first polarity through said guide means,
   said second magnet means comprises third and fourth spaced apart magnets, said second magnetic circuit linking a pole of said third magnet having a second polarity to a pole of said fourth magnet having a first polarity through an external air gap, said second circuit linking a pole of said third magnet having a first polarity to a pole of said fourth magnet having a second polarity through said guide means,
   said guide means includes first and second guide elements spaced from one another to provide an air gap as said high reluctance zone, leakage flux from said air gap being coupled through said center portion of said Wiegand wire.

7. The device of claim 6 further comprising:
   a low reluctance shunt movable relative to said first and second magnet means between a first proximate position near to said first magnet means and a second proximate position near to said second magnet means, said shunt when in said first proximate position providing a low reluctance path for said first field to enhance the magnitude of said first field at said center position of said Wiegand wire sufficient to cause the state of said Wiegand wire to be affected by said first field, said shunt when in said second proximate position providing a low reluctance path for said second field to enhance the magnitude of said second field at said center portion of said Wiegand wire sufficient to cause the state of said Wiegand wire to be affected by said second field.

8. The pulse generator of claim 5 wherein: said first magnet means comprises first and second spaced apart magnets having a first magnetic path therebetween that includes said module and a second magnetic path therebetween external of said module, and said second magnet means includes third and fourth spaced apart magnets having a third magnetic path therebetween that includes said module and a fourth magnetic path therebetween external of said module, and further comprising:

a low reluctance shunt movable between a first proximate position in said second magnetic path near to said first and second magnets and a second proximate position in said fourth magnetic path near to said third and fourth magnets, said shunt when in said first proximate position providing a low reluctance path for said first field to enhance the magnitude of said first field at said center position of said Wiegand wire sufficient to cause the state of said Wiegand wire to be affected by said first field, said shunt when in said second proximate position providing a low reluctance path for said second field to enhance the magnitude of said second field at said center portion of said Wiegand wire sufficient to cause the state of said Wiegand wire to be affected by said second field.

9. The device of any of claims 5, 6, 7 or 8 wherein: each of said guide means has a cavity, the outboard ends of said cavities encompassing said first and second ends of said module.

10. The device of claim 9 wherein;

said cavity of each of said guide elements is greater in cross sectional area adjacent said center portion of said module and lesser in cross sectional area adjacent an end portion of said module, said pick-up coil is wound on a center portion of said wire, the ends of said wire extending out of said coil, and said cavity of each of said guide elements includes a cylindrical recess for retaining an end of said wire.

11. The method of providing a pulse train comprising the steps of:

providing a pulser unit having (a) a Wiegand wire module having a Wiegand wire segment and a pickup coil wound on said segment, said module having first and second end portions, (b) ferromagnetic guide means encompassing at least first and second ends of said module, said guide means including a high reluctance zone and shaped to collect, conduct and guide incident flux to said high reluctance zone, flux saturation at said high reluctance zone causing leakage flux to be coupled to said Wiegand wire, (c) first magnet means adjacent to said guide means to provide a first magnetic field coupled to said Wiegand wire through said guide means, and (d) second magnet means adjacent to said guide means to provide a second magnetic field coupled through said guide means to said Wiegand wire, and alternately placing a ferro-magnetic shunt adjacent to said first and second magnet means to alternately provide low reluctance paths for said first and second magnetic fields and alternately switch said Wiegand wire by said first and second magnetic fields.

12. The method of claim 11 wherein, when said shunt is in a remote position, said first and second magnetic fields at said Wiegand wire are substantially equal in magnitude and opposite in direction.

* * * * *